United States Patent [19]
Lane et al.

[11] Patent Number: 5,687,104
[45] Date of Patent: Nov. 11, 1997

[54] METHOD AND APPARATUS FOR GENERATING DECOUPLED FILTER PARAMETERS AND IMPLEMENTING A BAND DECOUPLED FILTER

[75] Inventors: John E. Lane, Satellite Beach, Fla.; Dan Hoory, Austin; Phillip K. Brewer, Jr., Buda, both of Tex.

[73] Assignee: Motorola, Inc., Schaumburg, Ill.

[21] Appl. No.: 560,064

[22] Filed: Nov. 17, 1995

[51] Int. Cl.$^6$ .................................................. G06F 17/10
[52] U.S. Cl. .............................. 364/724.01; 364/724.06
[58] Field of Search .................... 364/724.01, 724.19, 364/483; 375/229, 264; 381/103; 327/558; 395/183.06; 455/190.1

[56] References Cited

U.S. PATENT DOCUMENTS

| | | | |
|---|---|---|---|
| 5,400,247 | 3/1995 | He | 364/148 |
| 5,524,022 | 6/1996 | Kihara et al. | 375/229 |
| 5,530,660 | 6/1996 | Sun et al. | 364/724.01 |

OTHER PUBLICATIONS

Motorola, Inc., "Digital Stereo 10-Band Graphic Equalizer Using the DSP56001," 1988, pp. 1-21.
Bohn, Dennis A., "Constant-Q Graphic Equalizers,"J. Audio Eng. Soc., vol. 34, No. 9, Sep. 1986, pp. 611-626.
JBL, Inc., "⅓ Octave Equalization and The JBL/UREI 5547A and 5549A," Technical Notes vol. 2, No. 1A, pp. 1-12.
McNally, G. W., "Microprocessor Mixing and Processing of Digital Audio Signals," Journal of the Audio Engineering Society, Oct. 1979, vol. 27, No. 10, p. 793-803.

*Primary Examiner*—Reba I. Elmore
*Assistant Examiner*—Monica Lewis

[57] ABSTRACT

A method (100) and data processing system (120) for filtering unfiltered signals (134) to produce filtered signals (136) in accordance with desired filter control parameters (124). Adjusted filter control parameters (130) are generated based upon user provided filter control parameters (124) and operational characteristics (128) of a filter (132) to be implemented. The adjusted filter control parameters (130) are provided to the filter (132) which filters the unfiltered signal (134) to produce the filtered signal (136). Using the adjusted filter control parameters (130), the filter (132) has a filtering function that agrees with the desired filter control parameters (124) to effectively band decouple the filter from bands of surrounding filters. A graphic equalizer (250) implements a multi-band digital filter function that substantially reduces the effects of interband coupling, producing a more accurate match to the original filter response specification.

27 Claims, 7 Drawing Sheets

FIG.1 -PRIOR ART- 5,687,104

METHOD AND APPARATUS FOR GENERATING DECOUPLED FILTER PARAMETERS AND IMPLEMENTING A BAND DECOUPLED FILTER

CROSS REFERENCE TO RELATED, COPENDING APPLICATIONS

This application is related to our commonly assigned copending patent application entitled: "Symmetrical Filtering Apparatus And Method Therefor" by John E. Lane et al., Attorney Docket Number SC-02955A and filed Oct. 25, 1995.

TECHNICAL FIELD OF THE INVENTION

This invention relates generally to the filtering of audio signals and, more particularly, to a method and associated apparatus for developing adjusted filter control parameters based upon desired filter control parameters and a known filter performance.

BACKGROUND OF THE INVENTION

Analog circuit components have been used for years to create circuits for filtering electrical signals. More recently, with the advent of digital computers, digital filtering algorithms have been advantageously used in data processing systems to filter digitized electrical signals. As is known in the data processing art, digitized analog signals may be obtained by converting the analog signals using an analog-to-digital (A/D) converter. Once the signals have been converted to digital signals, the data processing system, perhaps comprising a digital signal processor, may be used to filter the digitized analog signals to produce filtered digitized signals. After filtering, the digitized analog signals may be converted to analog signals using a digital-to-analog converter.

One particular device that performs filtering functions is called a graphic equalizer. A graphic equalizer typically comprises a number of band pass filtering functions residing in bands across a frequency spectrum. In the case of a graphic equalizer operating on audio signals, the frequency spectrum extends from a lower end of about 20 hertz to an upper end of around 20,000 hertz, the spectrum comprising a typical person's audible range. A typical graphic equalizer segments the frequency band into a number of bands having center frequencies and boundary frequencies. For each of these bands, the graphic equalizer will either boost the signal or cut the signal, depending upon the user input. By selectively varying the magnitude of an audio signal across the frequency band, the graphic equalizer may be used to reduce noise components, compensate for acoustical shortcomings, and even be used to compensate for user preferences in signal production. Acoustical shortcomings may include the non-ideal room acoustics, as well as non-ideal acoustical characteristics of speakers, amplifiers, microphones, and music reproduction equipment such as record and audio cassette tape players.

Unfortunately, the filtering characteristics of a graphic equalizer often distort desired control parameters provided by a user and cause the graphic equalizer to have a filter function that does not accurately represent the desired control parameters. As a result of the imperfect filter functions of each of the band pass filters within the graphic equalizer, each of the band pass filters varies signals in its own band as well as adjacent bands. Because of the inter-band effect the band pass filters have on adjacent bands, the performance in all the bands becomes skewed. The affect band pass filters have on adjacent bands is often called band coupling. Band coupling often results in greatly exaggerated or reduced filter performance in particular bands as compared to the user input settings. For example, with three adjacent bands set to a 6 dB boost, the actual boost at the center band may be 12 dB due to band coupling. Alternatively, a central band having a 6 dB cut setting surrounded by bands having 6 dB boost settings may produce an incorrect cut because of band coupling.

As is known in the art, the Q factor of a band pass filter relates the width of the filtering function of the band pass filter to the boost or cut level of the band pass filter. As a general proposition, as the Q factor of the filter increases the width of the filtering function produced by the filter decreases. Thus, in the prior art, the Q factor of band pass filters within a graphic equalizer has been increased in order to reduce the amount of band coupling among the filtering functions across the frequency spectrum. However, by increasing the Q factor of the band pass filters, the resultant response exhibits a ripple effect due to the narrow bandwidth of each individual filter which leads to response troughs between each filter peak. This overshoot and undershoot creates a ripple effect between the band frequencies. Resultantly, the overall performance of the high Q factor solution results in a non-smooth amplitude response across the frequency spectrum.

FIG. 1 illustrates a typical prior art frequency response of a three band graphic equalizer. The performance 10 has both a desired response 12 and an actual response 14. Band 1 of the graphic equalizer has a center frequency $F_{C1}$ and a first band width. Band 2 has a center frequency $F_{C2}$ and a second band width. Finally, band 3 has a center frequency $F_{C3}$ and a third band width. Band 1, band 2 and band 3 are adjacent across the frequency spectrum of interest. Desired filter control parameters show that, for the center frequency $F_{C1}$, a boost of 6 dB was selected. At the second center frequency $F_{C2}$, the desired response is a 3 dB boost. Finally, at the third center frequency $F_{C3}$, a 6 dB boost was selected. A desired response of the filter is shown as the solid line 12.

However, as illustrated in FIG. 1, the actual response 14 of the filter does not correspond sufficiently with the desired response 12. The actual response 14 varies from the desired response 12 because of the non-perfect operation of the band pass filters in each band and the coupling between adjacent bands. The actual response 14 varies greatly from the desired response 12 where the desired response 12 corresponds directly to a user's desired performance of the filter.

Thus there exists a need in the art for an apparatus and associated method that produces a frequency response in a filter that corresponds to a desired filter frequency response.

DETAILED DESCRIPTION OF THE SPECIFICATION

The present invention relates to a method and apparatus for filtering unfiltered signals to produce filtered signals. The method includes steps for receiving unfiltered signals, receiving desired filter control parameters, generating adjusted filter control parameters and filtering the unfiltered signal using the adjusted filter control parameters to produce the filtered signal. The method also includes an initial step of generating a decoupling matrix which corresponds to the filter. The decoupling matrix represents a measure by which the filter control parameters are adjusted to compensate for adjacent band contributions and, therefore, yield a response which more closely correlates with the desired filter response. A method for generating the decoupling matrix corresponding to the filter will be illustrated in greater detail in FIG. 7. The decoupling matrix of a particular filter is determined either theoretically or empirically through measurement of filter magnitude responses. Desired filter control parameters are input by a user. Based upon the knowledge of the decoupling matrix of the filter and the desired parameters, the method of the present invention generates adjusted parameters, that when applied to the filter, will produce a filtering function in accordance with the desired filter control parameters. When applied to a graphic equalizer or any other multi-band filter, the method and apparatus of the present invention produces an actual filter response that closely corresponds with the desired filter response desired by the user.

Generation of the decoupling matrix which corresponds to the filter will now be discussed in greater detail with reference to FIG. 7. To create a decoupling matrix for use in the present invention, a software test program or a hardware system may be used to execute the methodology illustrated in FIG. 7. Such a software test program or a hardware system is well known in the data processing art and will not be illustrated herein in greater detail.

Figure 7:
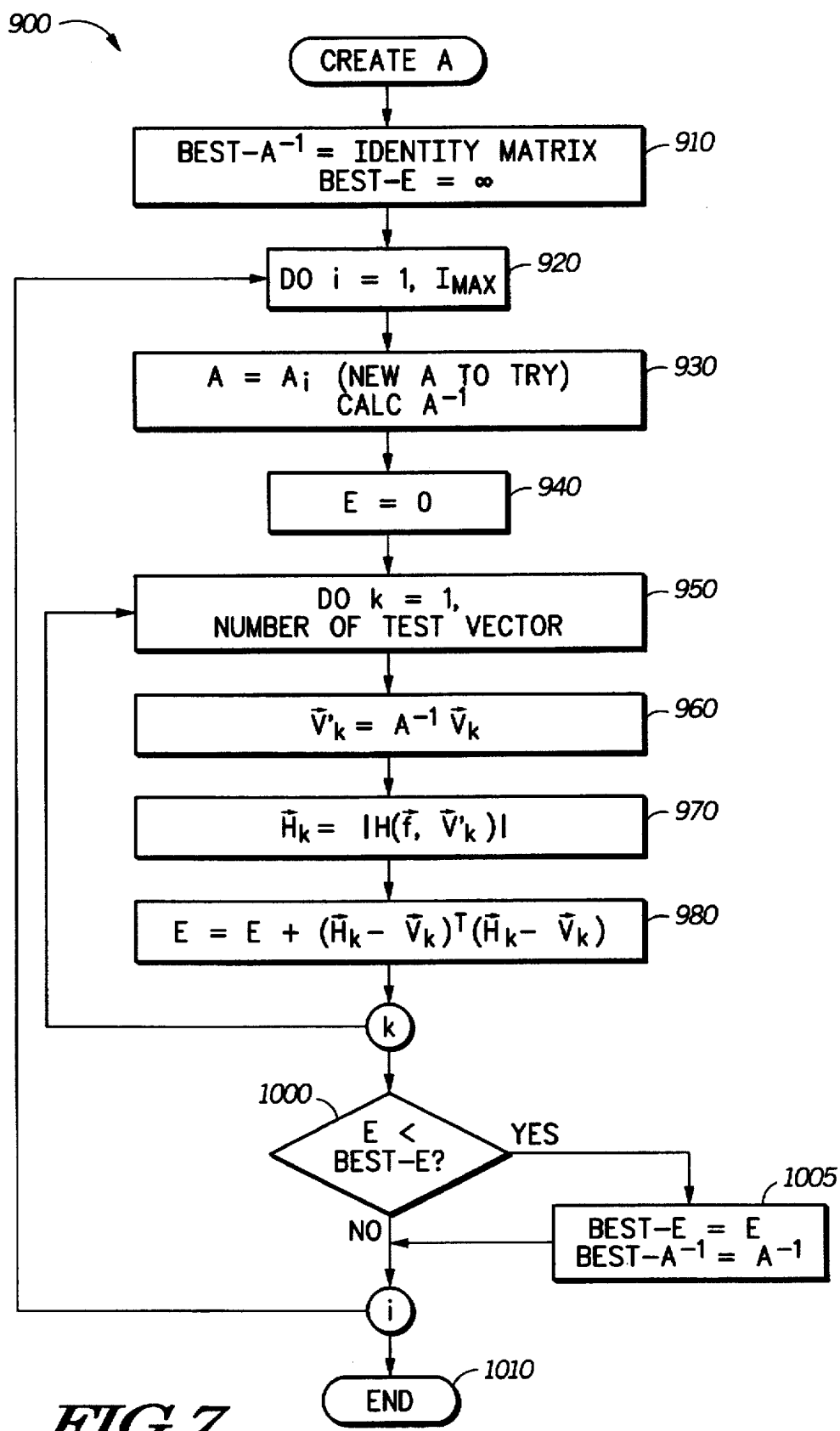
FIG. 7 is a flow chart diagram illustrating a method for generating a decoupling matrix in accordance with the present invention.

FIG. 7 illustrates a flow chart for calculating a decoupling matrix which may be used to enable a filter to more precisely filter an audio signal. In a first step 910 of a method 900 illustrated in the flow chart of FIG. 7, a best decoupling matrix, Best_$A^{-1}$, is initially set as the identity matrix and a best error, Best_E, is set to a very large number which effectively approximates infinity for the system on which it is implemented. Next, in a step 920, a number of matrices which are to be examined is established. In the flow chart illustrated in FIG. 7, the number of matrices is set to $I_{max}$. Note that the number of matrices to be examined is determined by a number of matrices stored in the software or hardware system which is executing the present initialization step.

For each of the number of matrices examined in the methodology illustrated in FIG. 7, a matrix A is set to a new matrix $A_i$ which corresponds to one of the plurality of matrices stored in the memory. Next, in step 930, an inverse of $A_i$, $A_i^{-1}$, is calculated. The inverse of $A_i$, $A_i^{-1}$, is calculated according to well known principles of linear algebra and will not be discussed in greater detail herein. Furthermore, note that the inverse of $A_i$, $A_i^{-1}$, may be interchangeably referred to as the decoupling matrix. In a subsequent step 940, the error (E) associated with the calculated decoupling matrix is initially set to zero.

Subsequently, in a next step 950, a number of test vectors (m) which are to be examined is established. Each of the test vectors (k) is provided by an external user for the purpose of testing the functionality of the present system. As is known in the data processing art, the test vector values may be provided by either a hardware circuit or a software circuit. For each of the test vectors, the actual vectors ($V_k$) generated are multiplied by the decoupling matrix to provide a modified test vector, $V_k'$ in step 960. Subsequently, a transfer function for each of the modified test vectors is calculated in a step 970. The quantity in step 970 is a filter transfer function which provides the input-to-output relationship of the filter. $H_k$ is a vector of length N, where N is the number of bands in the filter. Each "i'th" component of $H_k$ is the magnitude response of the filter determined by evaluating the filter transfer function at the "i'th" frequency $f_i$, using the set of modified gain test vectors, $V_k'$, where $V_k'$ is a vector of length N and is calculated in step 960. These magnitudes represented by the components of $H_k$ should ideally match the desired response boost/cut levels specified by $V_k$.

Next, in a step 980, an error associated with the test vector being evaluated is determined in accordance with the following equation:

$$E=E+(H_k-V_k)^T(H_k-V_k), \text{ where } H_k \text{ and } V_k \text{ are column vectors.} \quad (1)$$

The value of E calculated by equation (1) is subsequently stored in memory and used in a next calculation of the error for a next test vector. By repeating each of steps 960 through 980 for each of the test vectors, a total error, E, is eventually calculated and may be evaluated to determine if the matrix and its inverse being tested will be able to enable the filter providing the audio signal to perform its filtering functions more accurately.

Next, in a step 1000, the total error (E) calculated above for a matrix being tested, $A_i$, is compared with the Best_E value stored in memory prior to the receipt of the matrix. If the E value just calculated is less than the Best_E value, then, in step 1005, the Best_E value is set to the E value and the Best_$A^{-1}$ matrix is set to the decoupling matrix, $A_i^{-1}$ which corresponds to the E value. If the E value just calculated is greater that the Best_E value, then the Best_E value remains the same and the Best_$A^{-1}$ matrix remains the same.

Each of steps 930 through 1000 and step 1005, when required, is repeated for each of the matrices stored in the memory. At the end of the test flow illustrated in FIG. 7, the Best_$A^{-1}$ value indicates the best decoupling matrix which may be multiplied by received filtering control parameters to enable the filter to produce a filtered signal which is the most closely analogous to a desired filtered signal for an external user.

FIG. 7 illustrates a method for generating the decoupling matrix necessary to enable a filtering system to generate an accurate filtered signal. However, the decoupling matrix must be applied to data using the methodology illustrated in FIG. 2 to fully perform this function.

Figure 1:
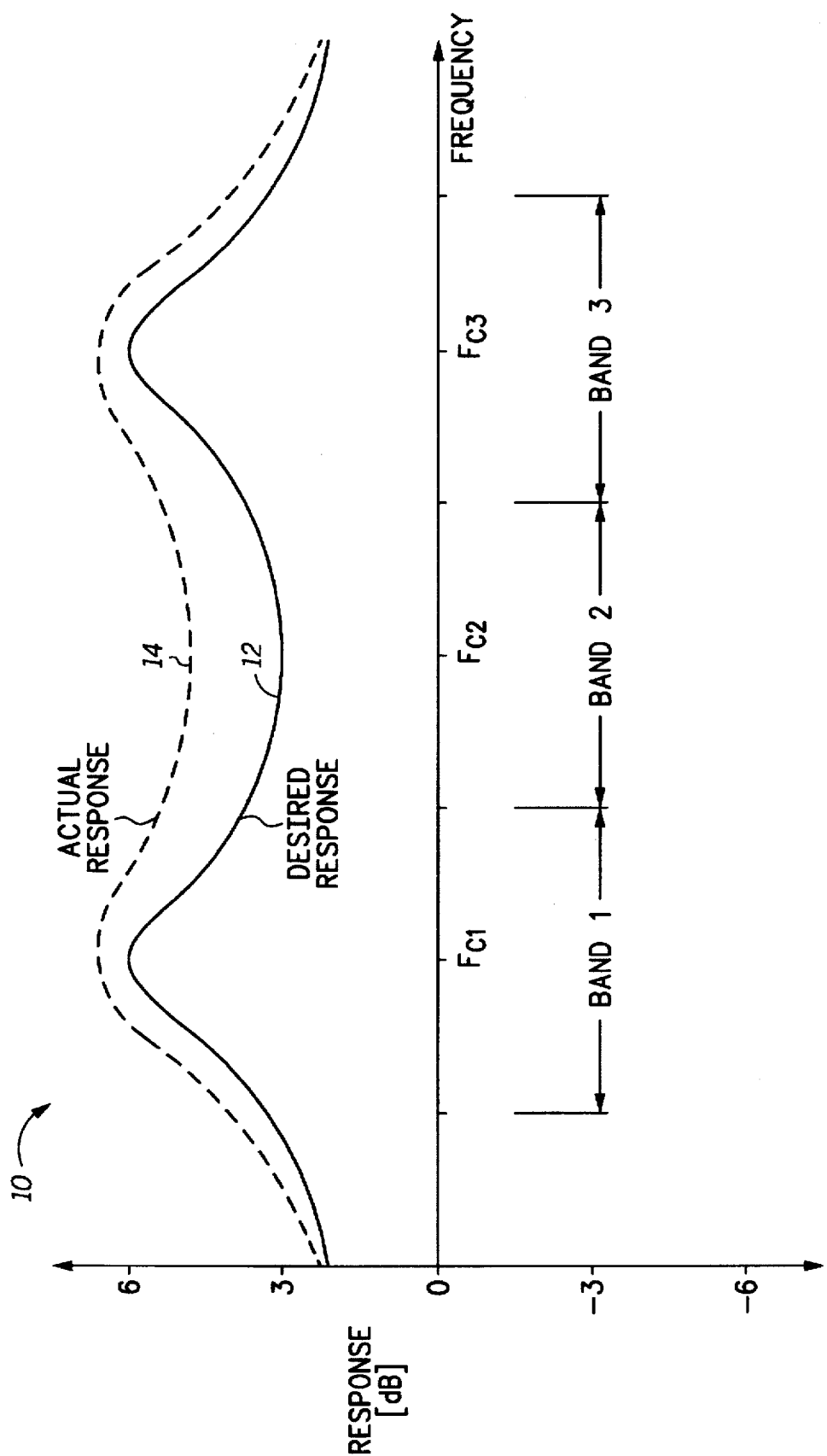
FIG. 1 is a graph illustrating a prior art filtering response as compared to a desired filter response.
Figure 2:
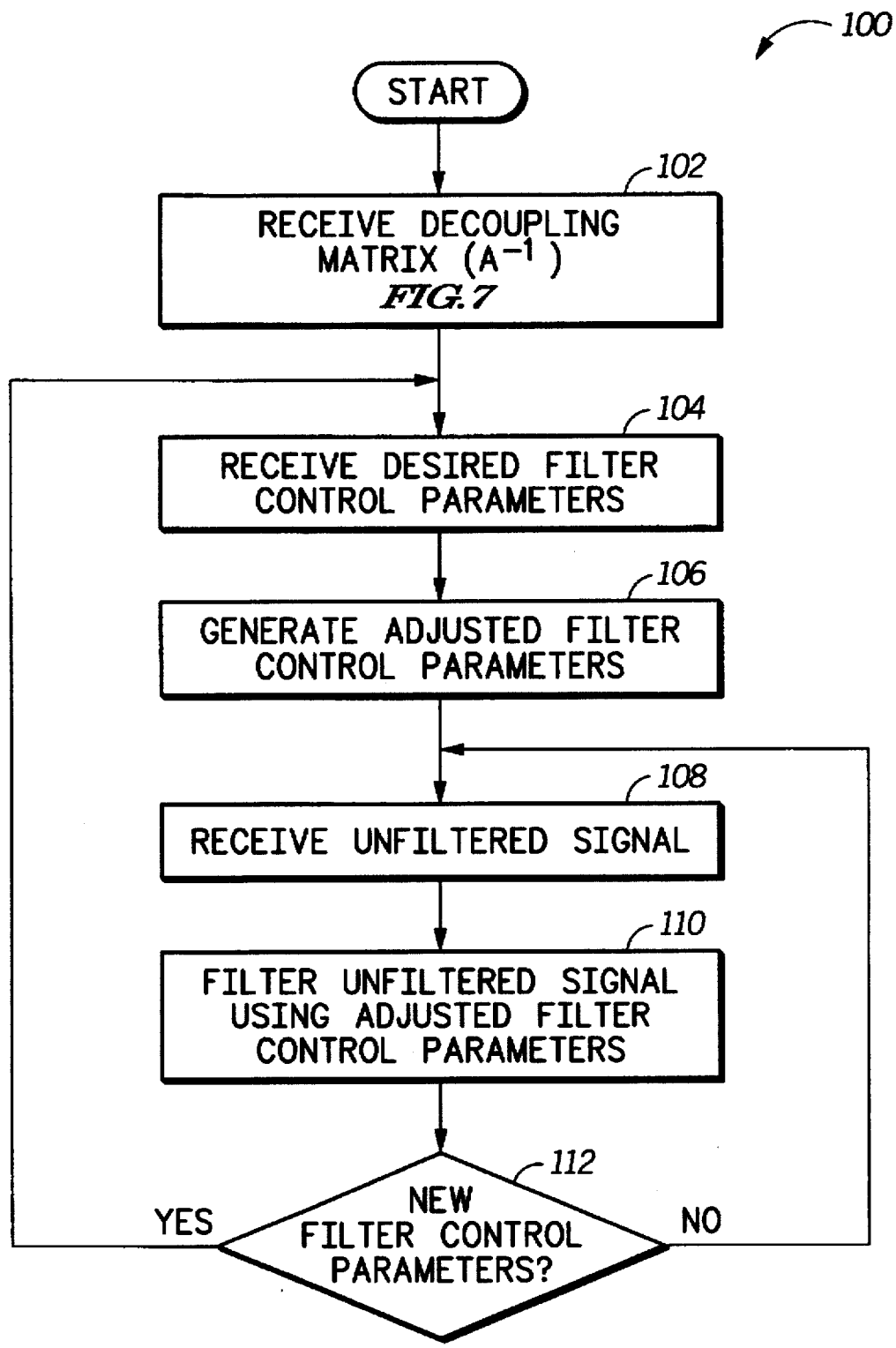
FIG. 2 is a flow chart diagram illustrating a method for filtering an unfiltered signal to produce a filtered signal in accordance with the present invention.

FIG. 2 illustrates a method 100 for filtering unfiltered signals to produce filtered signals in accordance with the present invention. As a first step in the method 100, step 102 includes receiving a decoupling matrix generated in accordance with the methodology illustrated in FIG. 7. As was previously described with reference to FIG. 7, the decoupling matrix corresponding to a particular filter may be determined based upon the construction of a particular filter and data received via testing the filter.

A particular frequency response of a filter may be either theoretically derived or experimentally derived. In the case of a digital filter, a filtering algorithm is selected that has a known performance across the frequency spectrum. In the case of a multi-band filter, each frequency band filter will have a known performance. In other cases, an actual filter construction may be tested to determine a frequency response across the frequency spectrum. In either case, the decoupling matrix is received in step 102. The decoupling matrix may be generated in accordance with a method previously discussed with respect to FIG. 7.

Next, at step 104, method 100 includes a step for receiving the desired filter control parameters. Preferably, the desired filter controlled parameters are received automatically from a control panel or other mechanism provided for receiving user input. Such other mechanisms include computer, switches, graphics, and user interfaces. It should be noted that a typical graphic equalizer includes a plurality of controls for receiving desired boost/cut values for a plurality of frequency bands. Each frequency band in the graphic equalizer has a particular center frequency. The boost/cut levels are generally the filter control parameters provided and received in step 104.

Next, at step 106, method 100 of the present invention includes a step for generating filter control parameters based on the desired filter control parameters and the decoupling matrix of the filter. The present invention provides a control parameter adjustment technique which will be described more fully hereinafter. The technique disclosed by the present invention uses a band decoupling matrix that relates adjusted filter control parameters to desired filter control parameters based upon the transfer function of the filter. A vector representing the adjusted filter control parameters is then determined by applying the band decoupling matrix to the desired filter controlled parameters. The band decoupling matrix is received in step 102 and applied to the desired filter control parameters to produce the adjusted filter control parameters in step 106.

Next, at step 108, method includes a step for receiving an unfiltered signal at a digital filter. The digital filter then performs a filtering function in accordance with the present invention. The unfiltered signal may comprise either an analog or a digital signal depending upon an application of the present invention. In either case, the unfiltered signal is to be further operated upon in accordance with the method 100 of the present invention.

Next, at step 110, method 100 of the present invention includes a step for filtering the unfiltered signal using the filter with the adjusted filter control parameters to produce the filtered signal. The filter has a filter function based upon the adjusted filter control parameters, such that an actual filter function of the filter corresponds with the desired filter control parameters and may accurately produce the filtered function.

From step 110, the method proceeds to step 112 wherein a determination is made whether new filter control parameters have been received. If new filter control parameters have been received from a user, the method proceeds again to step 104 to receive the new filter control parameters. However, if at step 112 it is determined that no new filter control parameters have been received, the method proceeds again to step 108 where the previously calculated filter control parameters are used to filter unfiltered signals to produce filtered signals.

Thus, the present invention provides the important benefit of improving the performance of a particular filter by decoupling bands such that actual boost/cut values are analogous to desired values. By adjusting the specified control parameters to the modified control parameters, the adjacent bands of interest within the filter are effectively decoupled so as to provide the desired filter control performance. Further, even when considering a single band filter, the method of the present invention may be used to generate a filter performance that matches a desired filter performance. As well, the benefits of the present invention relate to overall filtering performance because lower Q filters may be used to reduce unwanted side effects such as ripple.

Because the method of the present invention reaps the benefits of accurately filtering a signal without additional filter complexity, the benefits may be achieved in a cost effective manner. Further, if a particular filtering application already uses a data processing system to implement a digital filter, the data processor may also produce the adjusted filter control parameters without additional cost. Thus, the benefits obtained by the present invention, in some circumstances, may be obtained with little or no additional cost.

Figures 3, 4, 5:
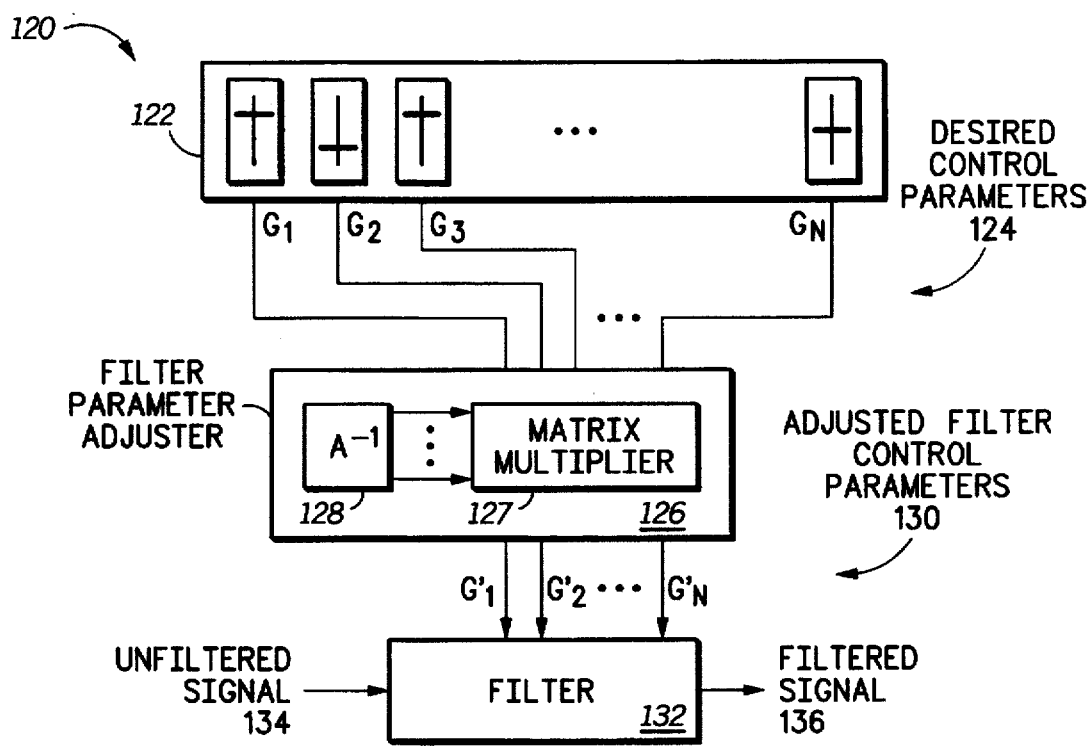
FIG. 3 is a block diagram illustrating an apparatus for filtering an unfiltered signal in accordance with the present invention.
FIG. 4 is an illustration of a mathematical equation in a matrix form used in accordance with the present invention.
FIG. 5 is an illustration of a matrix for use in conjunction with the present invention.

FIG. 3 illustrates a block diagram of an apparatus 120 for filtering data in accordance with the present invention. Apparatus 120 comprises a control panel 122, a filter parameter adjuster 126, and a filter 132. Control panel 122 receives user input and provides desired filter control parameters, $(G_1, G_2, G_3, \ldots G_N)$ 124 to the filter parameter adjuster 126. Filter parameter adjuster 126 includes a decoupling matrix 128 and a matrix multiplier 127. Furthermore, as illustrated in FIG. 3, control panel 122 may comprise an input such as that found in a graphic equalizer wherein a number of particular frequency bands are segregated into boost/cut selectors.

For example, $G_1$ through $G_N$ each comprise a boost/cut level for a respective frequency band of interest in control panel 122. If the setting for a particular frequency is zero dB, than the band pass filter for the particular frequency band does not operate on the signal in that frequency spectrum and provides simply a unity gain. Because a filter associated with each band of the frequency spectrum is not intended to operate on frequencies outside of its frequency band, a particular setting of unity gain or zero dB for a particular band will have no effect on the other frequency bands. However, as previously described, this is not the case in most situations.

Matrix multiplier 127 of filter parameter adjuster 126 receives the desired control parameters 124 from control panel 122. Matrix multiplier 127 is also coupled to decoupling matrix 128. Filter parameter adjuster 126 receives the decoupling matrix from either an internal memory (not illustrated herein) or an external source (not illustrated herein). As previously mentioned, the decoupling matrix is calculated before the filtering operation in accordance with the methodology illustrated in FIG. 7. Filter parameter adjuster 126 multiplies the desired filter control parameters $(G_1, G_2, \ldots G_N)$ 124 with the decoupling matrix to generate modified filter control parameters $(G'_1, G'_2, \ldots G'_N)$ 130.

The adjusted filter control parameters 130 are provided to filter 132. Filter 132 also receives an unfiltered signal 134 and subsequently filters the unfiltered signal 134 to produce filtered signal 136. In accordance with apparatus 120 illustrated in FIG. 3, apparatus 120 of the present invention performs the important function of filtering the unfiltered signals to produce a filtered signal which is in accordance with the user control settings provided at control panel 122.

FIG. 4 illustrates a relationship between the desired filter control parameters 124 ($G_1$ through $G_N$) and the adjusted filter control parameters 130 ($G_1'$ through $G_N'$). In the present invention, matrix A 152 relates the desired filter control parameters 150 to the adjusted filter control parameters 154. Stated another way, a general mathematical description of the particular parameters may be written as $G_N$ is equal to A times $G_N'$. By inverting the matrix A, a decoupling matrix $A^{-1}$ may be derived such that $G_N'$ is equal to the decoupling matrix $A^{-1}$ times $G_N$.

Thus, in the step 106 of the method illustrated in FIG. 2, the decoupling matrix $A^{-1}$ is multiplied by the $G_N$ vector 150 to obtain the $G_N'$ vector 154. The $G_N'$ vector is then provided to the filter implemented in accordance with the present invention to produce the filtered signal. By using the symmetrical Toeplitz matrix of FIG. 4 in accordance with the present invention, the complexity involved in generating the A matrix of FIG. 7 in accordance with the present invention is reduced. The reduction in complexity also reduces processing requirements and the cost associated with producing the decoupling matrix.

Additionally, note that the matrix inversion step illustrated in detail in FIG. 7 and used in step 102 of FIG. 2 is performed only once before a particular filter is used to perform a filtering operation. Once a decoupling matrix of a preselected filter is calculated, it may be used for all subsequent calculations and does not have to be recalculated with each use. The decoupling matrix must only be recalculated when the filtering parameters of the preselected filter are modified through design and component changes of the filter manufacturer. Therefore, although the matrix inversion step illustrated in FIG. 7 and used in step 102 of FIG. 2 is complex, once calculated, the resulting inverted matrix may be utilized quickly and efficiently to reduce the overall overhead costs associated with the filtering system.

Preferably, in the present invention, a matrix may be derived which relates the $G_N$ vector 150 to the $G_N'$ vector 154 in a manner which is based on the inherent properties of a multiple band filter and also reduces processing requirements. FIG. 5 illustrates a Toeplitz matrix which makes certain assumptions with respect to the coupling of adjacent bands within a multiple band filter. The assumptions include the expectation of a constant Q and the fact that the frequency bands to be filtered will be spaced equally on a logarithmic scale. These assumptions also characterize a graphic equalizer wherein a series of adjacent bands operate upon one another based upon their individual characteristics.

As is illustrated in FIG. 5, matrix A 160 includes diagonal elements D that are equal across the matrix and off diagonal elements that are fully symmetrical across the diagonal. Each element of matrix 160 that is one entry away from the diagonal is denoted $OD_1$ and are all equal. Each matrix element that is two entries from the diagonal is denoted $OD_2$ and are equal to one another. Such symmetry is repeated until the N−1 position is reached wherein the two matrix elements that are located N−1 positions from the diagonal of the N×N matrix are denoted $OD_{N-1}$ and are equal. This particular form of matrix is known as the Toeplitz matrix.

Because of the relatively symmetrical operation of the filtering function of the bands within a multi band filter, the Toeplitz matrix provides a decoupling matrix which produces lower error with less complex circuitry. As a general rule, the magnitude of $OD_1 > OD_2 > \ldots > OD_{N-1}$. Such is the case because as the distance between the bands increases, the coupling effect of one band on the other decreases significantly. The use of the Toeplitz matrix is appropriate in the present situation because in a typical graphic equalizer there are a plurality of band pass filters which each have an identical band width and band spacing on the logarithm scale, as well as identical gain characteristics. The only difference between bands is a different center frequency of operation. Thus, the symmetric nature of the band decoupling matrix closely matches the symmetry involved in a graphic equalizer having a plurality of band pass filters.

Furthermore, the present invention generates the decoupling matrix only once for each filter. It is modified only when the filter and, thus, the filter characteristics are modified. To generate a preferred A matrix 152 in the present embodiment of the invention, a nested loop is constructed that varies the value of the diagonal and off diagonal entries in the Toeplitz matrix in accordance with the methodology explained in FIG. 7. Then, for each particular set of values, at least one G vector 150 is selected and a respective G' vector 154 is determined. The G' 154 vector is provided to the digital filter and actual filter performance is measured. An error value is calculated for the actual filter performance based upon the G vector 150. The nested loop is repeated until a set of values of the A matrix 152 is determined that minimizes the error value. These values are then used to generate the G' 154 vector from the G vector 150.

Even though the use of matrices is discussed with reference to FIG. 4 and FIG. 5, one skilled in the art will appreciate that various methods for generating the adjusted filter control parameters are possible. In some situations, the generation of such adjusted filter control parameters will depend upon asymmetric operations of particular filters. The combination of adjacent filters across a frequency spectrum may not be symmetric. Such may be the case because filters do not operate perfectly or because non-symmetrical operation is intended. However, the Toeplitz matrix requires less complexity and provides good results in generating $A^{-1}$. Other types of matrices will work well, but may take longer to determine.

Figure 6:
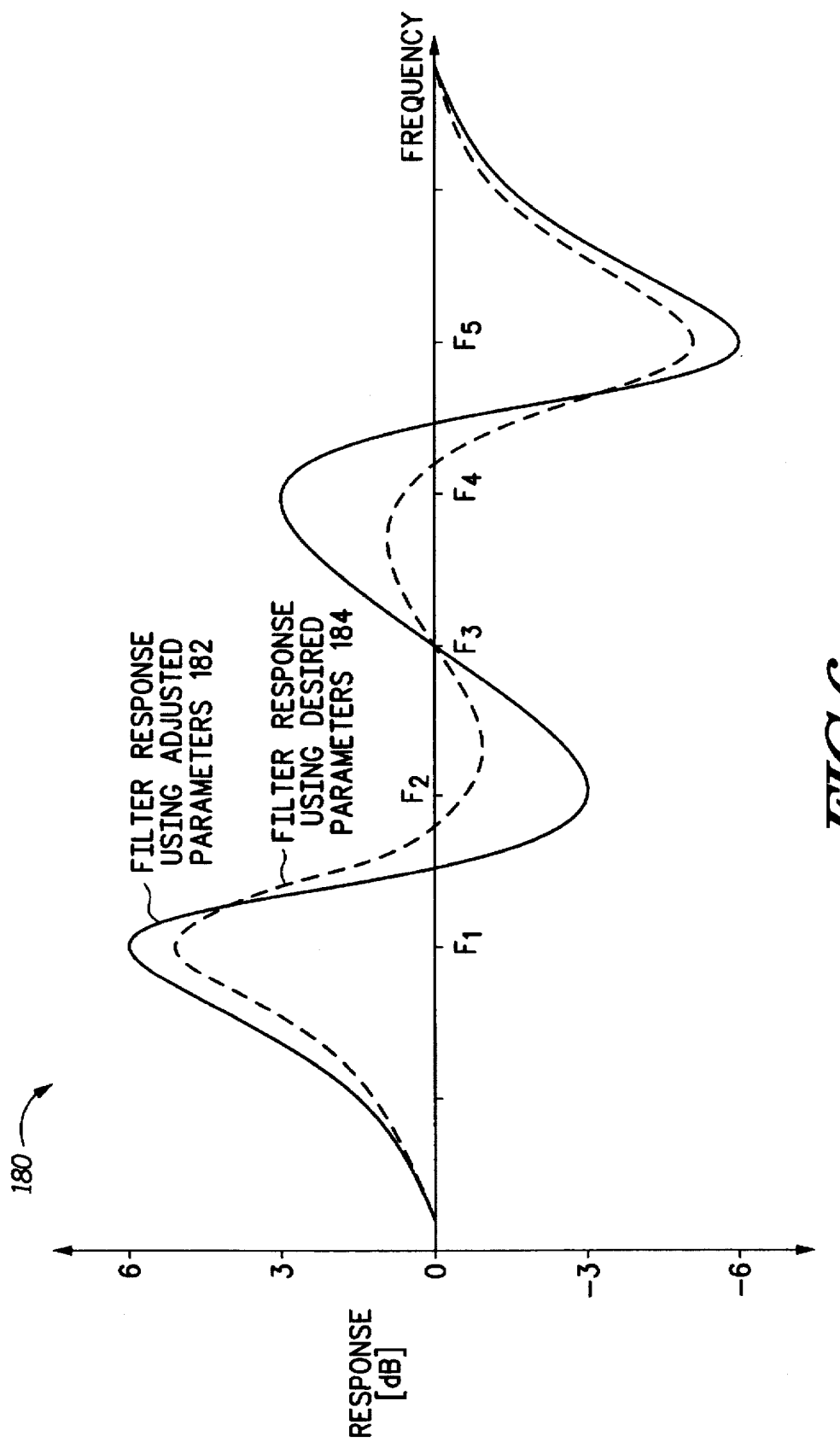
FIG. 6 is a graph illustrating a response of a filter using desired parameters and using adjusted parameters in accordance with the teachings of the present invention.

FIG. 6 is a graph illustrating a filter response 180 of a particular filter using two sets of input control parameters. The desired filter response requires a 6 dB boost at frequency $F_1$, a 3 dB cut at frequency $F_2$, a unity gain or zero boost/cut at $F_3$, a 3 dB boost at $F_4$, and a 6 dB cut at frequency $F_5$. Using the filter control parameters with no adjustment yields the response 184 which does not agree with the desired filter response. However, by using the adjusted filter control parameters, a response 182 which agrees substantially with the desired filter response may be yielded. Thus, the method of the present invention and the associated apparatus demonstrate the improved performance achieved in accordance with the principles of the present invention.

Figure 8:
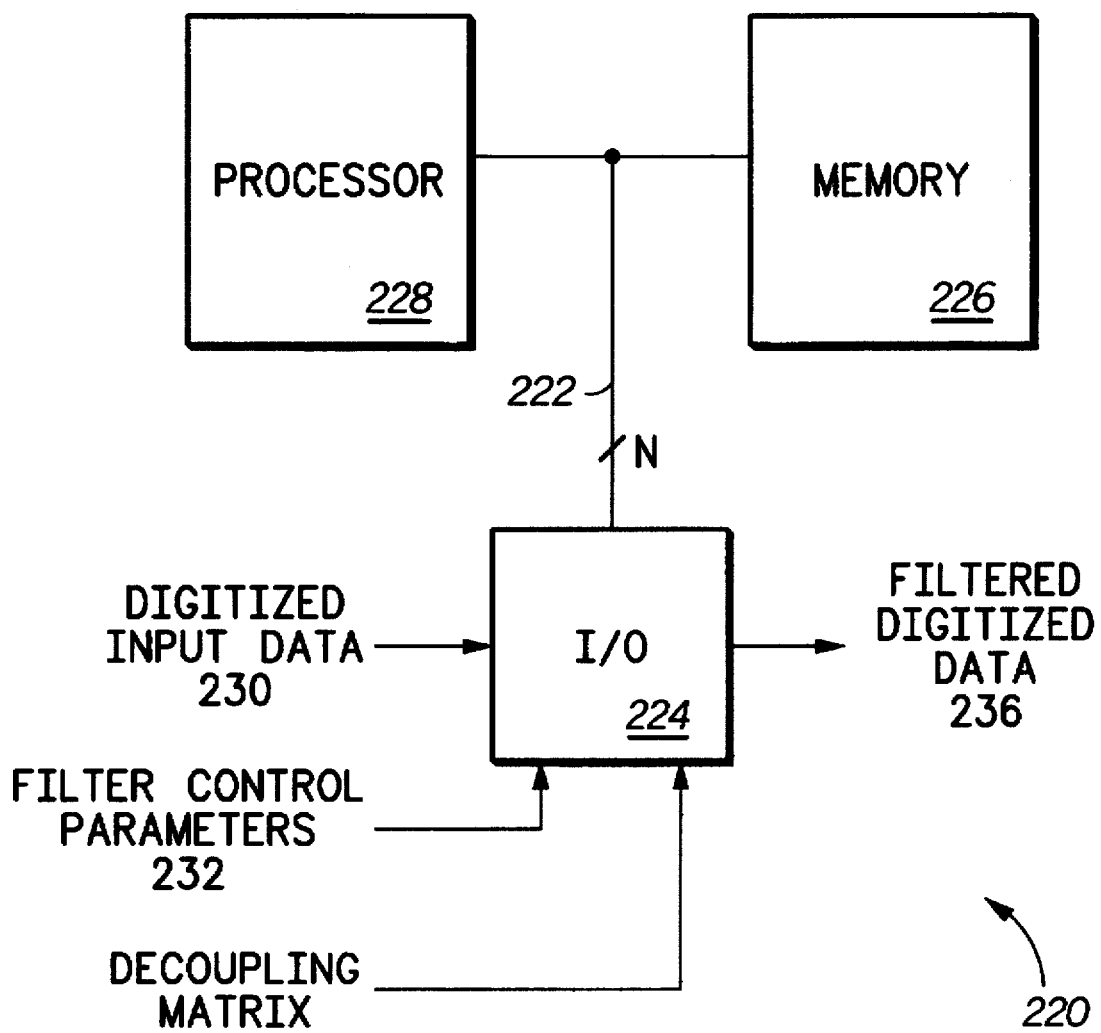
FIG. 8 is a block diagram illustrating a data processing system in accordance with the teachings of the present invention.

FIG. 8 illustrates a data processing system 220 for filtering digitized input data 230 to produce filtered digitized data 236. Data processing system 220 comprises a bus 222, an input/output ("I/O") port 224, a memory 226, and a processor 228. Bus 222 communicates data and instructions, preferably has a data width of N bits and, a construction known in the art that may be used in conjunction with data processing components.

I/O port 224 is coupled to bus 222 to receive filter control parameters 232 and a decoupling matrix 234 from a memory (not illustrated herein). I/O port 224 also receives digitized input data 230 and outputs or transmits filtered digitized data 236.

Memory 226 is coupled to the bus 222 to store filter control parameters 232, decoupling matrix 234, instructions, and digitized data 230. Memory 226 stores the digitized input data 230 after it has been communicated through I/O port 224 across bus 222 until it is operated upon by processor 228. Memory 226 may also store filtered digitized data 236 after it had been generated and before it has been output through I/O port 224.

Processor 228 is coupled to bus 222 to receive filter control parameters 232, decoupling matrix 234, and instructions from memory 226. Processor 228 calculates adjusted filter control parameters based upon the filter control parameters 232 and the decoupling matrix 234. As is known in the data processing art, and arithmetic logic unit (ALU) and control circuitry within processor 228 perform the multiplication functions required to generate the adjusted filter control parameters in the present embodiment of the invention. Processor 228 also implements a digital filter based on the adjusted filter control parameters and filters digitized data 230 to produce filtered digitized data 236 using the digital filter. The digital filter implemented by processor 228 has a filter function corresponding to the desired filter control parameters 232 and the decoupling matrix 234 so as to accurately produce the desired filtered digitized data 236.

As one skilled in the art will appreciate, data processing system 220 illustrated in FIG. 8 may comprise a digital signal processing system which has been programmed to produce the steps required by the data processing system of FIG. 8. The digital filter implemented by data processing system 220 of FIG. 8 may comprise a plurality of band pass filters. Each of these band pass filters includes a second order infinite response filter that provides a band pass function at a desired center frequency and over a desired band.

Preferably, the processor 228 provides additional functionality for calculating updated adjusted filter control parameters on receipt of updated filter control parameters. Because the filter control parameters 232 are received from a user, they will periodically change. Upon such a change, the data processing system 220 updates the adjusted filter control parameters to accurately implement the desired filtering function. Furthermore, the I/O port has an interrupt programmed to notify the processor when the filter control parameters 232 change so that new adjusted filter control parameters may be generated.

As is illustrated in FIG. 8, processor 228 may also include additional circuitry for generating a decoupling matrix based upon the transfer function of the filter. In this fashion, processor 228 receives data relating to the operation of the digital filter and generates the decoupling matrix based upon the data. Preferably, the A matrix is a symmetric, Toeplitz matrix.

Thus, data processing system 220 of the present invention provides the important benefit of filtering unfiltered data using a filter function that accurately portrays the input settings provided by the user. In this fashion, performance is identical or nearly identical to the desired performance without any significant increase in cost.

Figure 9:
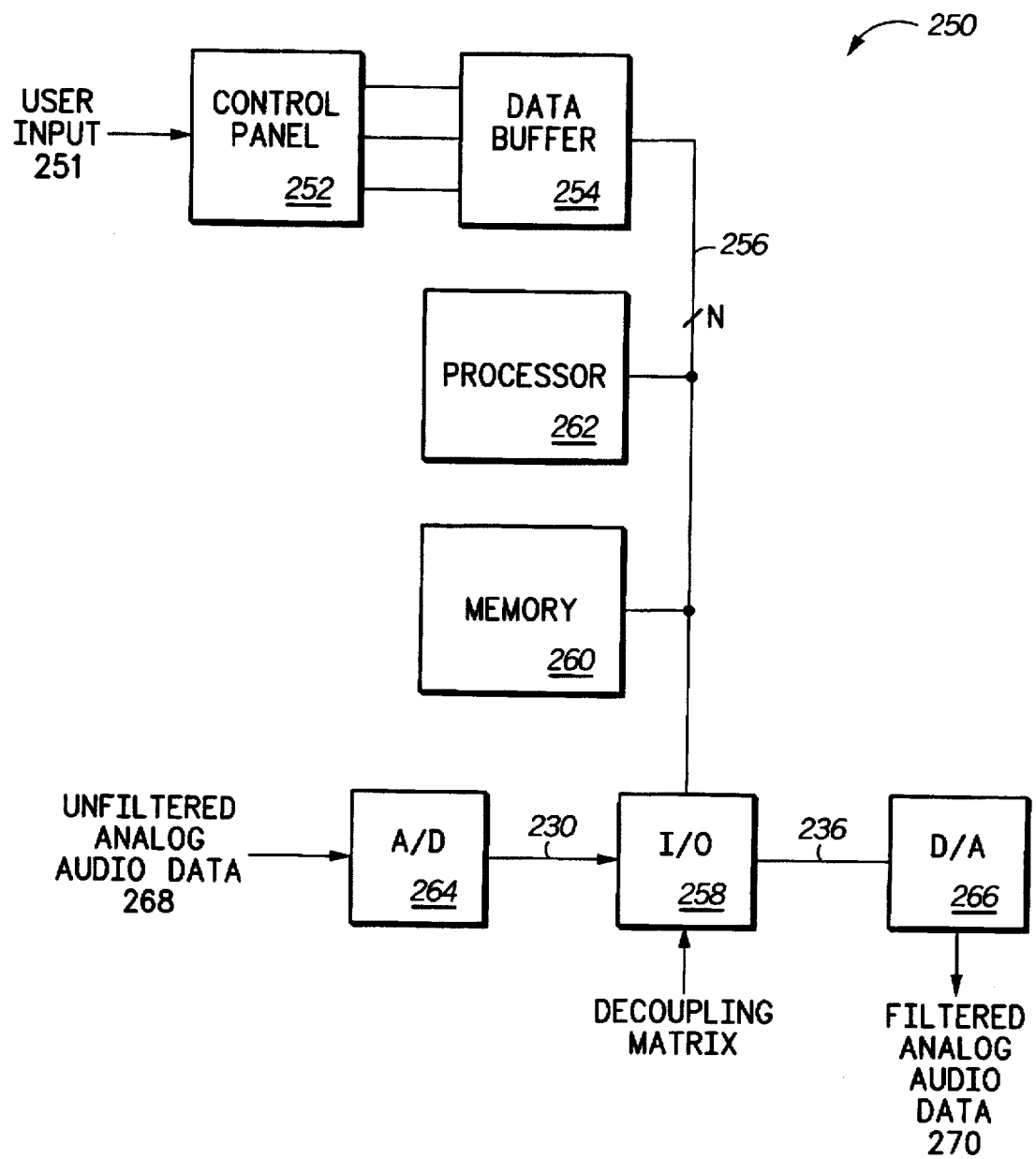
FIG. 9 is a block diagram of a graphic equalizer in accordance with the present invention.

FIG. 9 illustrates a graphic equalizer 250 for selectively filtering audio data. The graphic equalizer comprises a control panel 252, a data buffer 254, a bus 256, an I/O port 258, a memory 260, and a processor 262. Graphic equalizer 250 also includes an analog to digital (A/D) converter 264 and a digital to analog (D/A) converter 266.

The control panel 252 receives filter control parameters 251 from a user. Preferably, these filter control parameters 251 will include boost/cut levels for a plurality of frequency bands having center frequencies that have been preprogrammed for user selection. However, a user may also preselect center frequencies and frequency band widths as well for a plurality of bands across the frequency spectrum for other applications, within limits of the constraints imposed by the mathematical properties of the invention. These limits are empirically determined by the process described in FIG. 7, using the filter transfer function or its corresponding response data, of the filter network in question, and by noting the relative magnitude of Best_E. If this value is not acceptable, then the filter network under investigation may not be a candidate for use in the present invention. This decision is made by an external user.

The data buffer 254 is coupled to the control panel 252 and receives the filter control parameters 251 from the control panel 252. The bus 256 is coupled to the data buffer 254 and communicates instructions and digitized data amongst the components of the present invention. Preferably, the bus has a data width of N bits and has the capability to provide address signals, data signals, and control signals throughout the components of the invention.

The I/O port 258 is coupled to bus 256 to receive digitized audio data from A/D converter 264 and to transmit filtered digitized auto data to D/A converter 266. The I/O port 258 allows for the receipt and transmission of digital data. Preferably, I/O port 258 includes a serial port that sequentially receives and transmits data in a serial fashion. However, I/O port 258 may also include a parallel port, depending on the particular application. The I/O port 258 will preferably also receive the decoupling matrix 234 that has been empirically or theoretically derived for the particular filter function implemented by graphic equalizer 250 in accordance with the methodology disclosed in FIG. 7.

Memory 260 is coupled to bus 256 for storing filter control parameters 251, decoupling matrix 234, and digitized audio data 230. Memory 260 is capable of storing and producing digital data based upon addresses and control signals. Further, the memory 260 preferably stores sufficient data to enable the operation of graphic equalizer 250.

Processor 262 is coupled to the bus 256 to receive the filter control parameters 251, the filter operational characteristics 234, and instructions from memory 260. Processor 262 calculates the adjusted filter control parameters based upon the filter control parameters and the decoupling matrix. Processor 262 implements a digital filter based upon the adjusted filter control parameters to filter the digitized input data 230 to produce filtered digitized data 236. The digital filter implemented by the processor 262 has a filter function corresponding to the desired filter control parameters so as to accurately produce the filtered signal.

A/D converter 264 is coupled to I/O port 258 to receive unfiltered analog audio data 268. A/D converter 264 converts the unfiltered analog audio data 268 to unfiltered digitized audio data 230. Conversely, the D/A converter 266 receives the filtered digitized audio data 236 from the I/O port 258, converts the filtered digitized audio data 236 to produce the filtered analog data 270, and outputs the data. In this fashion, graphic equalizer 250 of FIG. 9 may be implemented in the digital domain and convert signals appropriately so that the graphic equalizer 250 may be used within an analog system.

The graphic equalizer of the present invention provides the important advantage of producing a filtering function that corresponds with the user input 251 at a minimal cost. The benefits are provided with little additional processing requirements and no additional hardware requirements. The filtering function produced in accordance with the graphic equalizer 250 has minimal ripple effects and corresponds to user input 251.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A method for filtering an input signal to produce a filtered signal, comprising the steps of:
   (a) receiving a transfer function of a filter;
   (b) receiving a first plurality of desired filter control parameters;
   (c) generating a plurality of adjusted filter control parameters in response to the first plurality of desired filter control parameters and the transfer function of the filter, including applying a band decoupling matrix to the first plurality of desired filter control parameters to generate the plurality of adjusted filter control parameters;
   (d) receiving the input signal; and
   (e) enabling a filter to apply a first plurality of the plurality of adjusted filter control parameters to the input signal to provide the filtered signal having a desired signal characteristic.

2. The method of claim 1, further comprising the step of:
   (f) upon receipt of updated filter control parameters, repeating a step (d) and a step (e) until a second plurality of desired filter control parameters are received.

3. The method of claim 1, wherein a step (b) further comprises the steps of:
   receiving a plurality of center frequency values, wherein each of the plurality of center frequency values corresponds to a band pass frequency of a desired filter function; and
   receiving a desired filter boost/cut level for each of the plurality of center frequency values.

4. A method for filtering an input signal to produce a filtered signal, comprising the steps of:
   (a) receiving a transfer function of a filter;
   (b) receiving a first plurality of desired filter control parameters, a plurality of center frequency values, wherein each of the plurality of center frequency values corresponds to a band pass frequency of a desired filter function, and a desired filter boost/cut level for each of the plurality of center frequency values;
   (c) generating a plurality of adjusted filter control parameters for a plurality of band pass filters in response to the first plurality of desired filter control parameters and the transfer function of the filter, wherein each of the plurality of band pass filters corresponds to one of the plurality of center frequency values and each of the plurality of adjusted filter control parameters is based upon a one of the first plurality of desired filter control parameters corresponding to a respective center frequency and a coupling error resulting from an adjacent one of the plurality of band pass filters;
   (d) receiving the input signal; and
   (e) enabling a filter to apply a first plurality of the plurality of adjusted filter control parameters to the input signal to provide the filtered signal having a desired signal characteristic.

5. The method of claim 1 wherein an inverse of the band decoupling matrix is symmetrical. The method of claim 5 wherein an inverse of the band decoupling matrix is symmetrical.

6. The method of claim 1 wherein a step (e) a digital filter is used to apply the first plurality of adjusted filter control parameters to the input signal to provide the filtered signal having a desired signal characteristic.

7. The method of claim 6 wherein a digital signal processor implements the digital filter.

8. A data processing system, comprising:
   bus means for communicating data and a plurality of instructions;
   an input/output port coupled to the bus means for receiving a plurality of filter control parameters, a transfer function of a filter, and input data, and wherein the input/output port transmits filtered data;
   a memory coupled to the bus means, wherein the memory stores the plurality of filter control parameters, the transfer function of the filter, a portion of the plurality of instructions, and data; and
   a data processor coupled to the bus means, the data processor receiving the plurality of filter control parameters, the transfer function of the filter, and the portion of the plurality of instructions from the memory and the data processor calculating a plurality of adjusted filter control parameters using the plurality of filter control parameters and the transfer function of the filter, the processor implementing the filter such that the filter uses the plurality of adjusted filter control parameters to filter the input data and accurately produce the filtered data having a signal characteristic corresponding to the plurality of desired filter control parameters, the data processor generating a band decoupling matrix based on the transfer function of the filter and applying an inverse of the band decoupling matrix to the plurality of desired filter control parameters to produce the plurality of adjusted filter control parameters.

9. The data processing system of claim 8 wherein the digital filter comprises a plurality of band pass filters.

10. The data processing system of claim 9 wherein each of the plurality of band pass filters comprises a second order infinite impulse response (IIR) filter.

11. The data processing system of claim 8, wherein the data processor calculates a plurality of updated adjusted filter control parameters when a plurality of updated filter control parameters are provided to the input/output port.

12. The data processing system of claim 8 wherein the plurality of filter control parameters comprise:
   a plurality of center frequencies, wherein each of the plurality of center frequencies represents a band pass frequency of a desired filter function; and
   a plurality of desired filter boost/cut levels, wherein each of the plurality of desired filter boost/cut levels corresponds to one of the plurality of center frequencies.

13. A data processing system, comprising:
   bus means for communicating data and a plurality of instructions;
   an input/output port coupled to the bus means for receiving a plurality of filter control parameters, a transfer function of a filter, and input data, and wherein the input/output port transmits filtered data;
   a memory coupled to the bus means, wherein the memory stores the plurality of filter control parameters, the transfer function of the filter, a portion of the plurality of instructions, and data; and
   a data processor coupled to the bus means, the data processor receiving the plurality of filter control parameters, the transfer function of the filter, and the portion of the plurality of instructions from the memory and the data processor calculating a plurality of adjusted filter control parameters using the plurality of filter control parameters and the transfer function of the filter, the processor implementing the filter such that the filter uses the plurality of adjusted filter control parameters to filter the input data and accurately produce the filtered data having a signal characteristic corresponding to the plurality of desired filter control parameters wherein the plurality of filter control parameters comprise:

a plurality of center frequencies, wherein each of the plurality of center frequencies represents a band pass frequency of a desired filter function; and a plurality of desired filter boost/cut levels, wherein each of the plurality of desired filter boost/cut levels corresponds to one of the plurality of center frequencies, and wherein the data processor generates the plurality of adjusted filter control parameters for each of a plurality of band pass filters, wherein each of the plurality of band pass filters corresponds to one of the plurality of center frequencies, each of the plurality of band pass filters using a corresponding one of the plurality of adjusted filter control parameters to filter a coupling effect of an adjacent one of the plurality of band pass filters from the filtered data.

14. The data processing system of claim 13, wherein an inverse of the band decoupling matrix comprises a symmetrical matrix.

15. A digital audio system, comprising:

a control panel for receiving a plurality of external inputs, the control panel providing a plurality of desired filter control parameters;

storage means for communicating and storing a decoupling matrix;

a matrix multiplier coupled to the control panel for receiving the plurality of desired filter control parameters and coupled to the storage means for receiving the decoupling matrix, the matrix multiplier multiplying the plurality of desired filter control parameters and the decoupling matrix to generate a plurality of adjusted filter control parameters;

input means for receiving an input signal;

a filter coupled to the input means for receiving the input signal and coupled to the matrix multiplier for receiving the plurality of adjusted filter control parameters, the filter using the plurality of adjusted filter control parameters to filter the input signal and generate a filtered output signal.

16. The digital audio system of claim 15 wherein the plurality of external inputs indicate a corresponding one of a plurality of boost/cut levels.

17. The digital audio system of claim 15 wherein each of the plurality of desired filter control parameters corresponds to a preselected frequency band.

18. The digital audio system of claim 15 wherein an inverse of the decoupling matrix is a symmetrical matrix.

19. The digital audio system of claim 16 wherein the inverse of the decoupling matrix is Toeplitz matrix.

20. The digital audio system of claim 15 wherein the storage means, the matrix multiplier, and the filter are implemented using a digital signal data processor.

21. The digital audio system of claim 15 wherein the decoupling matrix corresponds to a transfer function of the filter.

22. A method for filtering a signal, comprising the steps of:

receiving a decoupling matrix, wherein the decoupling matrix reflects a transfer function of a filter;

receiving a first plurality of desired filter control parameters from a control interface;

generating a first plurality of adjusted filter control parameters in response to the decoupling matrix and the first plurality of desired filter control parameters;

receiving an input signal; and filtering the unfiltered signal using the first plurality of adjusted filter control parameters.

23. The method of claim 22 further comprising the steps of:

receiving a second plurality of desired filter control parameters from the control interface; and generating a second plurality of adjusted filter control parameters in response to the decoupling matrix and the second plurality of desired filter control parameters.

24. The method of claim 22 wherein a step of generating a first plurality of adjusted filter control parameters, further comprises the step of:

multiplying the first plurality of desired filter control parameters and the decoupling matrix.

25. The method of claim 22 further comprising the step of:

iteratively calculating the decoupling matrix.

26. The method of claim 25 further comprising the steps of:

i. retrieving a matrix from a memory;

ii. calculating an inverse of the matrix;

iii. retrieving a plurality of test vectors from the memory;

iv. calculating a plurality of adjusted test vectors by multiplying the inverse of the matrix and each of the plurality of test vectors;

v. calculating a plurality of transfer functions corresponding to the plurality of adjusted test vectors, wherein each of the plurality of transfer functions corresponds to one of the plurality of adjusted test vectors;

vi. calculating a composite error associated with the plurality of test vectors using the plurality of test vectors and the plurality of transfer functions;

vii. comparing the composite error with a best error value; and viii. providing the inverse of the first matrix as the decoupling matrix when the composite error is less than the best error value.

27. The method of claim 26 further comprising the steps of:

ix. storing the composite error as the best error value when the composite error is less than the best error value.

x. repeating steps i. through viii. for each of a plurality of matrices stored in the memory.

* * * * *